United States Patent [19]

Abe

[11] Patent Number: 5,485,021
[45] Date of Patent: Jan. 16, 1996

[54] SEMICONDUCTOR DEVICE WITH OPTICAL WAVEGUIDES TO ACHIEVE SIGNAL TRANSMISSION USING OPTICAL MEANS

[75] Inventor: Takao Abe, Annaka, Japan

[73] Assignee: Shin-Etsu Handotai Co., Ltd., Tokyo, Japan

[21] Appl. No.: 258,637

[22] Filed: Jun. 10, 1994

[30] Foreign Application Priority Data

Jun. 17, 1993 [JP] Japan .................................. 5-171150

[51] Int. Cl.$^6$ .............................. G02B 6/12; G02B 5/14
[52] U.S. Cl. .............................. 257/84; 257/82; 257/432; 385/14
[58] Field of Search .................... 385/14, 8; 257/80, 257/84, 432, 82, 83

[56] References Cited

U.S. PATENT DOCUMENTS 4,966,430  10/1990  Weidel ........................... 385/14
5,159,700  10/1992  Reid et al. ....................... 385/14
5,200,631   4/1993  Austin et al. ..................... 385/14

FOREIGN PATENT DOCUMENTS 61-121014  6/1986  Japan ............................ 385/14

*Primary Examiner*—Donald L. Monin, Jr.
*Attorney, Agent, or Firm*—Ronald R. Snider

[57] ABSTRACT

A semiconductor device 30 is configured with a transparent insulator substrate 31 in which an optical waveguide(s) 37 is formed, a semiconductor thin film 32 is pasted on the transparent insulator substrate 31, an integrated circuit(s) 33 is formed on the semiconductor thin film 32, a light emitting device(s) 34 is connected to the wiring of the integrated circuit 33, and a light detecting device(s) 36 is optically connected to the light emitting device(s) 34 via the optical waveguide(s) 37. Some wiring segments of the integrated circuit 33 are thereby replaced with the optical waveguide(s) 37 so as to optically transmit signals.

14 Claims, 2 Drawing Sheets

SEMICONDUCTOR DEVICE WITH OPTICAL WAVEGUIDES TO ACHIEVE SIGNAL TRANSMISSION USING OPTICAL MEANS

BACKGROUND OF THE INVENTION

1. Field of the Invention

This invention relates to a semiconductor device, and more precisely to a semiconductor device in which some segments of the wiring are replaced with optical waveguides to achieve signal transmission using optical means,

2. The Prior Art

In recent years, large scale integrated circuits (LSI) have become more and more integrated, and the wiring (metallization) which electrically connects circuit elements has become more dense. With the progress of higher integration, it becomes more and more difficult to place the wiring on a two-dimensional plane without crossing each other, so the wiring has been one of the obstacles of higher integration, Therefore, multi-layer wiring, which comprises three-dimensional wiring, has been introduced.

However, the following problems remain with multi-layer wiring: 1) the problem of the contact resistance between the upper and lower wiring, 2) the problem of the wiring materials, 3) the problems of the insulation materials which insulate between the upper and lower wiring, and 4) the problem of shape control such as planarization. All of these are difficult problems.

As a result, a technique has been proposed (Jpn. J. Appl. Phys. Vol. 32 (1993), p270) which replaces some segments of the LSI wiring with optical waveguides in the optical plate provided outside and optically transmits signals. According to this method, as shown in FIG. 6, an optical plate 20 made of quartz glass in which an optical waveguide(s) is formed is sandwiched between two integrated circuit substrates 10a and 10b comprising an integrated circuit 12 formed on a semiconductor single crystal substrate 11, and optical signals are transmitted through said optical plate 20 between a laserdiode (LD) 13 and a photodiode (PD) 14 provided in the integrated circuit substrates 10.

The method described above is an epoch making method which replaces part of the wiring conventionally done only using aluminum and such metal wiring with optical signal transmission, and introduction of this method into practical use is receiving attention.

However, the problems accompanying higher integration of LSI's, as described above, include not only the difficulties in the wiring process but also problems due to the structure of the integrated circuit substrate. That is, the conventional configuration of an integrated circuit substrate, in which the integrated circuit is formed on a semiconductor single crystal substrate made of bulk crystal, has devices formed on bulk crystal, and because of this, parasitic effects such as latch-ups due to generation of thyristor structures and parasitic capacity are produced and affect the characteristics of the devices. With the progress of even higher integration, these kinds of problems have become more and more conspicuous, and development of a means to simultaneously solve both said wiring problems and the problems due to the parasitic effects have been desired.

SUMMARY OF THE INVENTION

This invention has been carried out in light of various problems accompanying the higher integration of LSI's, as described above, and provides a semiconductor device which simultaneously solves both the problems of wiring difficulty and parasitic effects, allowing efficient and high-density wiring and reducing the influence of parasitic effects.

This invention provides a semiconductor device of comprising a transparent insulator substrate in which an optical waveguide(s) is formed, a semiconductor thin film pasted on said transparent insulator substrate, an integrated circuit(s) formed on said semiconductor thin film, a light emitting device(s) connected to the wiring of said integrated circuit and a light detecting device(s) which is optically connected to said light emitting devices(s) via said optical waveguide(s), and replaces some segments of the wiring of said integrated circuit with said optical waveguide(s) so as to optically transmit signals.

The transparent insulator substrate is made of, for example, quartz glass, sapphire or aluminum nitride. An optical path altering means to alter the direction of the light from said light emitting device(s) is provided on said optical waveguide(s) in said transparent insulator substrate. An example of the optical path altering means would be a slant surface(s) facing a prescribed direction formed in said transparent substrate, coated with a reflective coating film. For the reflective coating film, a metal vapor deposition film such as silver can be used, for example.

As the light emitting device, a laserdiode would be preferable. It can be made using porous Si or compound semiconductor. As the light detecting device, a photodiode would be preferable. A lens(es) can be provided on the surface of the transparent insulator substrate corresponding to the light emitting surface of the light emitting device and/or to the light detecting surface of the light detecting device. A configuration example for the lens would be the formation of an area with a higher refractive index on the surface of the transparent insulator substrate.

The layered semiconductor device of this invention comprises a plurality of semiconductor devices as described above which are layered on top of each other, and the wiring between each of said semiconductor devices is achieved via optical signal transmission.

The semiconductor devices of this invention have an ideal structure for devices. That is, instead of the conventional configuration in which the integrated circuit portion is formed on a bulk crystal substrate, a "Silicon on Insulator" or SOI structure is adopted, comprising a semiconductor single thin film formed on an insulator substrate and the integrated circuit formed on this semiconductor thin film. This structure is free of the parasitic effects such as latch-ups and generation of parasitic capacity which cause problems when forming an integrated circuit portion on bulk crystal, and has an excellent effect on the characteristics of the device.

Furthermore, the semiconductor device of this invention uses a transparent insulator substrate for said insulator substrate, and this makes it possible to transmit optical signals via said transparent insulator substrate composing the optical waveguide, and thus solve conventional problems related to wiring, as described above, at the same time. Also, since the substrate of the semiconductor device of this invention does not have an electric charge, it has the significant effect of eliminating delays in the propagation of high frequency signals.

The process of obtaining a basic configuration of this invention follows: an optical waveguide(s) is formed on the top surface, inside and on the bottom surface of a transparent insulator substrate made of synthetic quartz glass, sapphire or aluminum nitride (Corning glass can be used for a low temperature process). This transparent insulator substrate is pasted together with a silicon wafer, and then the silicon wafer is made into a silicon thin layer. As the method of pasting together the transparent insulator substrate and the silicon wafer, a method which uses the bonding heat treatment, a method which uses an adhesive such as silicone resin with no heat treatment, etc., may be adopted. The semiconductor device of this invention can be obtained by forming an integrated circuit portion on this silicon thin film layer and at the same time forming combinations of a laserdiode(s) and a photodiode(s) in such a way that they are aligned with the optical waveguide(s).

This invention is not an extension of conventional technology but an application of completely new optical technology. Furthermore, by adopting the technology of pasting a silicon wafer on the insulator substrate, the integrated circuit substrate and the optical plate are produced as a single unit, rather than provided separately, thus making the manufacturing process much easier. The semiconductor device of this invention does not have contacts such as are used in conventional multi-layer wiring, and therefore does not give rise to the problem of contact resistance. Also, this invention can achieve high speed operation and low power consumption. When layering a large number of microprocessors, such as in a neuron system, a plurality of semiconductor devices of the configuration described above are layered and the optical waveguides will make connections within the horizontal plane and in the vertical direction. In this case, the wiring efficiency increases even more because special optical bus lines are not required.

DETAILED DESCRIPTION

Figure 1:
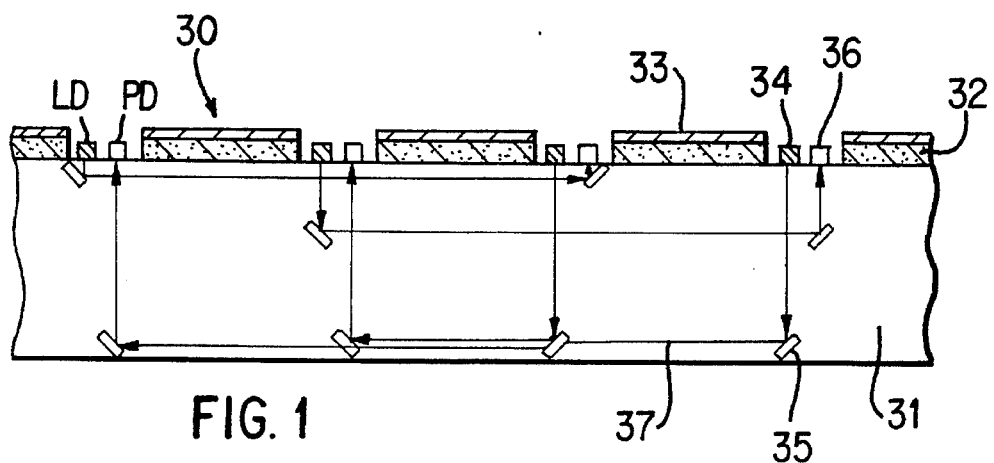
FIG. 1 is a partial schematic cross section of one example of the semiconductor device of this invention.

This invention is described next by referring to the drawings. FIG. 1 is a partial schematic cross section of one example of the semiconductor device of this invention. The configuration of the semiconductor device 30 of this example follows: a silicon wafer is pasted on a transparent insulator substrate 31 made of synthetic quartz glass and such, said silicon wafer is made into a silicon thin film 32 with a thinning treatment, and an integrated circuit 33 is formed on said silicon thin film 32. For the method of pasting together the transparent insulator substrate 31 and the silicon wafer, either the bonding heat treatment or adhesives such as silicone resin, as described above, can be used.

On the transparent insulator substrate 31, a laserdiode(s) 34 which converts electric signals from the integrated circuit 33 to optical signals and a photodiode(s) 36 which converts optical signals to electrical signals are provided. In the optical waveguide(s) 37 in the transparent insulator substrate 31, a reflector(s) 35 is provided. By placing this reflector 35 as needed, the direction of the optical signal can be altered and thus the optical signal can be transmitted from the laser 34 to a photodiode 36 at a desired position.

Figures 2, 3:
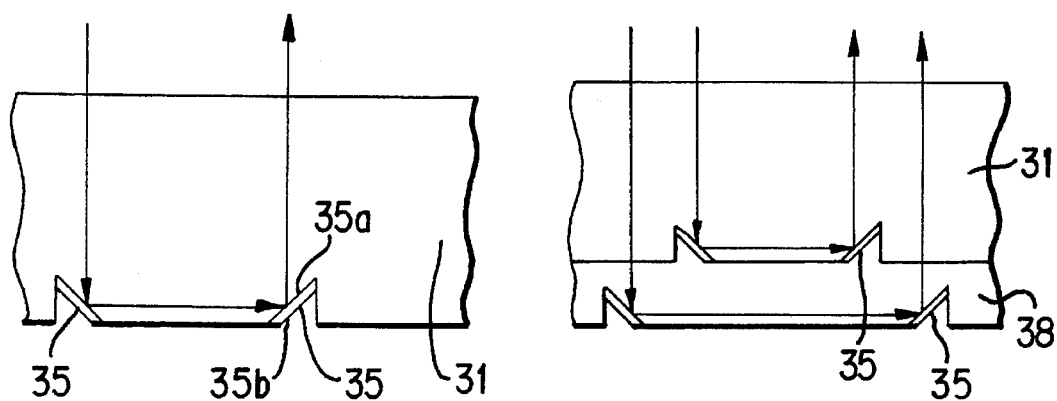
FIG. 2 is a schematic cross section of a configuration example of the reflector 35.
FIG. 3 is a schematic cross section of a configuration example of the reflector 35.

The reflector 35 has the following structure, as shown in FIG. 2: the bottom surface of the transparent insulator substrate 31 is partially removed to form a slant surface 35a, and a silver vapor deposition film 35b, for example, is formed on this slant surface 35a. Also, as shown in FIG. 3, after forming the reflector 35 on the bottom surface of the transparent insulator substrate 31, the reflectors 35 and 35 with different horizontal positions can be formed by further forming a $SiO_2$ film 38 on the bottom surface of said transparent insulator substrate 31, by means of sputtering, and forming the reflector 35.

Figure 4:
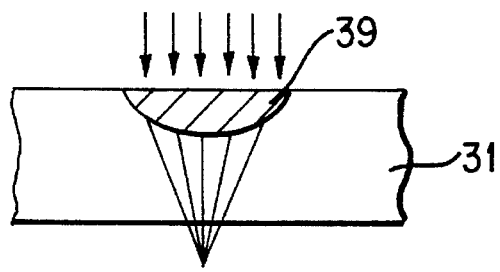
FIG. 4 is a schematic cross section of a configuration example of the micro-lens 39.

For the purpose of increasing transmission efficiency of optical signals, a micro-lens(es) 39 may be provided on the surface of the transparent insulator substrate right below the light emitting surface and the light detecting surface of the laser 34 and photodiode 36, respectively. As shown in FIG. 4, the micro-lens 39 comprises a high refractive index portion formed by the introduction of $Tl^+$, for example. In this case, the transparent insulator substrate 31 is preferably multi-component quartz Glass containing Na or K. This micro-lens 39 gives a higher light condensation effect, further improving the transmission efficiency.

The semiconductor device 30, whose configuration is described above, has a wiring structure which is a combination of metal wiring using aluminum and such and optical wiring via light using the optical waveguide 37 in the transparent insulator substrate 31. This is an ideal structure which solves the problems of conventional multi-layer wiring. In particular, by using a plurality of lights with different wavelengths, for example, optical multi-communication is possible, allowing transmission of a plurality of different signals using the same optical waveguide. Therefore, an extremely high wiring density can be achieved.

Figure 5:
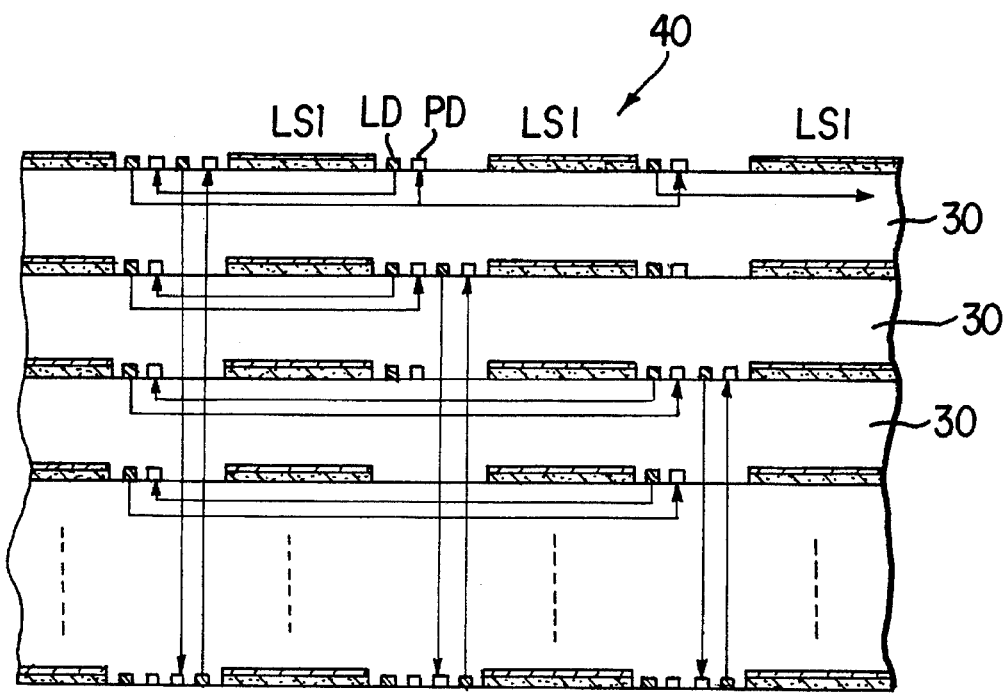
FIG. 5 is a schematic cross section of one example of a semiconductor device with a layered structure.
Figure 6:
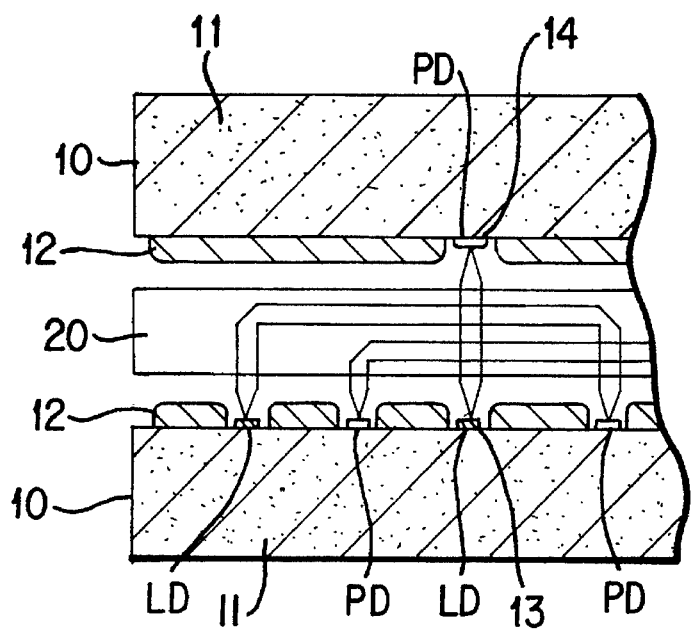
FIG. 6 is a schematic cross section of a wiring structure example using an optical plate.

FIG. 5 shows a layered semiconductor device 40 comprising a plurality of the semiconductor devices 30 described above stacked together. The configuration of this layered semiconductor device 40 can be applied when layering a large number of microprocessors such as for a neuron system. In this configuration, unlike conventional configurations, the contact resistance between layers is not a problem and very efficient wiring is possible.

The example described above shows a concrete configuration according to this invention. However, needless to say, this invention is not limited to the example described above, and the conditions and configurations of the example described above can be changed within the range consistent with the purpose of this invention. For example, while the example described above uses a reflector(s) comprising a slant surface(s) coated with metal vapor deposition, this can be replaced by some other appropriate means. Also, for the light emitting device(s) and light sensing element(s), any means can be used as long as optical signal transmission is possible.

As described thus far, this invention solves both the problem of wiring difficulties accompanying higher integration of LSI's and the problem of the parasitic effects and such, allowing for efficient and high density wiring and reducing the parasitic effects which affect the devices.

I claim:

1. A silicon-on-insulator (SOI) semiconductor device having a structure where a plurality of silicon thin films are isolated from each other wherein:

at least one integrated circuit is formed in each of said thin film's;

said thin films are attached on a light conducting electrically insulating substrate which serves as a substrates for electronic and optical devices;

a light emitting device is located on said light conducting electrically insulating substrate and connected to interconnections of said integrated circuit formed in one of said semiconductor thin films;

a light detecting device is located on said light conducting electrically insulating substrate and connected to interconnections of said integrated circuit formed in an other one of said semiconductor thin films; and an optical path is formed in said light conducting electrically insulating substrate to connect said light emitting device with said light detecting device so as to optically transmit signals.

2. A semiconductor device as described in claim 1 wherein said light conducting electrically insulating substrate is made of material selected from a group consisting of quartz glass, sapphire, and aluminum nitride.

3. A semiconductor device as described in claim 1 wherein an optical path altering means is provided in said light conducting electrically insulating substrate to alter the direction of the light from said light emitting device.

4. A semiconductor device as described in claim 3 wherein said optical path altering means comprises a slant surface facing a prescribed direction formed in said light conducting electrically insulating substrate and coated with a reflective film.

5. A semiconductor device as described in claim 4 wherein said reflective film is a metal vapor deposition film.

6. A semiconductor device as described in claim 1 wherein said light emitting device is a laserdiode.

7. A semiconductor device as described in claim 1 wherein said light detecting device is a photodiode.

8. A semiconductor device as described in claim 1 wherein lenses are provided on a surface of said light conducting electrically insulating substrate corresponding to a light emitting portion of said light emitting device.

9. A semiconductor device as described in claim 8 wherein said lens comprises an area with a high refractive index formed on a surface area of said light conducting electrically insulating substrate.

10. A semiconductor device as described in claim 1 wherein lenses are provided on a surface of said light conducting electrically insulating substrate corresponding to a light detecting surface portion of said light detecting device.

11. A semiconductor device as described in claim 10 wherein said lens comprises an area with a high refractive index formed on a surface area of said light conducting electrically insulating substrate.

12. A semiconductor device as described in claim 1 wherein lenses are provided on a surface of said light conducting electrically insulating substrate corresponding to a light emitting portion of said light emitting device and to a light detecting portion of said light detecting device.

13. A semiconductor device as described in claim 12 wherein said lens comprises an area with a high refractive index formed on a surface area of said light conducting electrically insulating substrate.

14. A layered semiconductor device comprising a plurality of semiconductor devices as described in claim 1 layered on top of each other, characterized by the fact that the interconnection between each of said plurality of semiconductor devices is achieved via optical signal transmission.

* * * * *